United States Patent
Higashida et al.

(10) Patent No.: US 9,024,173 B2
(45) Date of Patent: May 5, 2015

(54) THERMOELECTRIC CONVERSION ELEMENT MODULE AND METHOD OF MANUFACTURING THE SAME

(75) Inventors: Takaaki Higashida, Osaka (JP); Kaori Toyoda, Hyogo (JP); Takashi Kubo, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 117 days.

(21) Appl. No.: 13/881,596

(22) PCT Filed: Mar. 28, 2012

(86) PCT No.: PCT/JP2012/002154
§ 371 (c)(1),
(2), (4) Date: Apr. 25, 2013

(87) PCT Pub. No.: WO2012/137446
PCT Pub. Date: Oct. 11, 2012

(65) Prior Publication Data
US 2013/0220394 A1    Aug. 29, 2013

(30) Foreign Application Priority Data
Apr. 6, 2011   (JP) ................. 2011-084267

(51) Int. Cl.
H01L 35/34   (2006.01)
H01L 35/28   (2006.01)
H01L 35/04   (2006.01)
H01L 35/32   (2006.01)

(52) U.S. Cl.
CPC ............. *H01L 35/04* (2013.01); *H01L 35/32* (2013.01); *H01L 35/34* (2013.01)

(58) Field of Classification Search
None
See application file for complete search history.

(56) References Cited

U.S. PATENT DOCUMENTS

| 5,064,476 A | 11/1991 | Recine |
| 5,171,372 A | 12/1992 | Recine |
| 5,982,013 A | 11/1999 | Kishi et al. |

(Continued)

FOREIGN PATENT DOCUMENTS

| CN | 1925183 A | 9/2010 |
| CN | 101836285 A | 9/2010 |

(Continued)

OTHER PUBLICATIONS

International Search Report for Application No. PCT/JP2012/002154 dated May 7, 2012.

*Primary Examiner* — Eli Mekhlin
(74) *Attorney, Agent, or Firm* — Pearne & Gordon LLP

(57) ABSTRACT

The present invention provides a thermoelectric conversion element module and a manufacturing method thereof capable of easily realizing a high-density array and securing connection reliability. The module includes a thermoelectric conversion element group made up of P-type elements and N-type elements alternately arranged in a first direction and a heat-resistant insulating member filling the periphery of the thermoelectric conversion materials, wherein the P-type elements and the N-type elements are connected via connection electrodes on a side portion of the group along the first direction, and connection electrodes at other parts of the group along a second direction crossing the first direction. The module is manufactured by forming a connection electrode layer that extends to the side portion of the group on the surface of the group and cutting this connection electrode layer between the thermoelectric conversion elements along the first direction and the second direction.

2 Claims, 9 Drawing Sheets

(56) References Cited

U.S. PATENT DOCUMENTS

| | | |
|---|---|---|
| 2007/0044828 A1 * | 3/2007 | Iwanade et al. ............... 136/230 |
| 2008/0023057 A1 | 1/2008 | Nakajima et al. |
| 2008/0163916 A1 | 7/2008 | Tsuneoka et al. |
| 2009/0032080 A1 | 2/2009 | Kawauchi et al. |
| 2010/0193003 A1 | 8/2010 | Lee et al. |
| 2011/0114145 A1 | 5/2011 | Yang et al. |

FOREIGN PATENT DOCUMENTS

| | | | |
|---|---|---|---|
| DE | 102006040283 A1 | | 3/2007 |
| JP | 11-26118 A | | 9/1999 |
| JP | 11-261119 A | | 9/1999 |
| JP | 11261118 A | * | 9/1999 |
| JP | 2000252529 A | * | 9/2000 |
| JP | 2002-359407 A | | 12/2002 |
| JP | 2003-298122 A | | 10/2003 |
| JP | 2004-328013 A | | 11/2004 |
| JP | 2006-093364 A | | 4/2006 |
| JP | 2007-013000 A | | 1/2007 |
| JP | 2007-227508 A | | 9/2007 |
| WO | 2009/026466 A1 | | 2/2009 |

* cited by examiner (A)

(B)

(A)

(B)

(C)

THERMOELECTRIC CONVERSION ELEMENT MODULE AND METHOD OF MANUFACTURING THE SAME

TECHNICAL FIELD

The present invention relates to a thermoelectric conversion element module and a method of manufacturing a thermoelectric conversion element module.

BACKGROUND ART

Elements taking advantage of a Peltier effect or Seebeck effect are used as thermoelectric conversion elements. Since thermoelectric conversion elements have a simple structure, are easy to handle and able to maintain a stable characteristic, widespread use of thermoelectric conversion elements is attracting attention in recent years. Especially when used as an electronic cooling element, the thermoelectric conversion element can perform local cooling and accurate control over temperature close to a room temperature. And therefore a wide range of studies are being carried for stabilizing temperature of opto-electronics and semiconductor laser or the like.

The aforementioned thermoelectric module for electronic cooling element or thermoelectric power generation is configured as shown in FIG. 11 by connecting P-type thermoelectric conversion element (P-type semiconductor) 5 and N-type thermoelectric conversion element (N-type semiconductor) 6 via a connection electrode (metal electrode) 7 to form a PN element pair, and then arranging a plurality of such PN element pairs in series. One end of P-type thermoelectric conversion element 5 and N-type thermoelectric conversion element 6 is heated and the other end is cooled, which is set based on the direction of a current flowing through each PN element pair. In FIG. 11, reference numerals 8 and 9 denote external connection terminals, 10 denotes a ceramic substrate and H denotes an arrow indicating a heat flow direction.

The material for thermoelectric conversion element has large performance index $Z (=a^2/rK)$ expressed by Seebeck coefficient "a" which is a substance-specific constant, specific resistance "r" and thermal conductivity "K", which are used in the temperature region where the element is used. Crystal materials generally used as thermoelectric conversion elements are $Bi_2Te_3$-based materials. These crystals have an outstanding cleavage property, that is, these crystals are known to have a problem that an yield extremely decrease due to cracking or chipping by undergoing slicing and dicing or the like for obtaining a thermoelectric conversion element from an ingot.

To solve this problem, a method of manufacturing a thermoelectric conversion element module is proposed, which includes: heating step of heating/melting a mixing material powders having a desired composition; coagulation step of forming a solid solution ingot of a thermoelectrically conversion material having a rhombohedral structure (hexagonal structure); crushing step of crushing the solid solution ingot so as to obtain solid solution powder; sizing step of uniformalizing the grain size of the solid solution powder; sintering step of sintering the uniformalized solid solution powder under a pressure; and hot upset forging step of hot-pressing and rolling the sintered substance so as to be plastic-deformed, and thereby orienting crystal structure of the sintered substance in a crystal orientation for achieving an excellent performance index or the like (e.g., see Patent Literature 1).

Furthermore, a conventional method of manufacturing a thermoelectric conversion element module includes: manufacturing an alloy ingot; crushing the alloy ingot into raw powder having an average powder grain size of 0.1 micron (um) or above and 1 um or below, under a vacuum with an oxygen concentration of 100 ppm or below or under an atmosphere of inert gas; and sintering the raw powder through electric resistance heating while adding a pressure to the raw powder. In the sintering process, the raw powder is subject to joule heat from a pulsed current and pressure of 100 kg/cm² or above and 1,000 kg/cm² or below (9.8 MPa or above and 98.1 MPa or below). A thermoelectric conversion material with a fine crystal grain size and with excellent workability can be manufactured through this method (e.g., see Patent Literature 2).

Furthermore, a conventional thermoelectric conversion element module is known, which includes a thermoelectric conversion element group comprising a plurality of P-type thermoelectric conversion elements and a plurality of N-type thermoelectric conversion elements, a pair of substrates sandwiching the thermoelectric conversion element group, and a connection electrode which is arranged on a surface on the element group side of the substrates and which electrically connects the P-type thermoelectric conversion element and the N-type thermoelectric conversion element in series (e.g., see Patent Literatures 3 to 9). Furthermore, a conventional thermoelectric conversion element module is known, which includes a thermoelectric conversion element group comprising a plurality of P-type thermoelectric conversion elements and a plurality of N-type thermoelectric conversion elements, and a connection electrode which is provided on the end faces of P-type thermoelectric conversion element and N-type thermoelectric conversion element adjacent each other and which electrically connects the elements each other (e.g., see Patent Literature 10).

CITATION LIST

Patent Literature

[PTL 1]
Japanese Patent Application Laid-Open No. 11-261119
[PTL 2]
Japanese Patent Application Laid-Open No. 2003-298122
[PTL 3]
Japanese Patent Application Laid-Open No. 2004-328013
[PTL 4]
U.S. Pat. No. 5,982,013, Specification
[PTL 5]
Japanese Patent Application Laid-Open No. 2002-359407
[PTL 6]
Japanese Patent Application Laid-Open No. 2007-227508
[PTL 7]
US Patent Application Publication No. 2009/0032080, Specification
[PTL 8]
US Patent Application Publication No. 2008/0023057, Specification
[PTL 9]
US Patent Application Publication No. 2008/0163916, Specification
[PTL 10]
Japanese Patent Application Laid-Open No. 2006-93364

SUMMARY OF INVENTION

Technical Problem

However, since the thermoelectric conversion element module requires a temperature difference between the high temperature side and the low temperature side, thermal stress is imposed on both of the thermoelectric conversion element and on the connection electrode, due to a thermal expansion caused by the temperature difference. When the temperature difference increases for obtaining a large potential difference, the stress at the junction between the thermoelectric conversion element and the connection electrode also increases. In the conventional thermoelectric conversion element module, the connection electrode is connected to only the thermoelectric conversion material. Therefore, the connection reliability against the stress is not high. Furthermore, since the conventional thermoelectric conversion element module is manufactured by individually mounting thermoelectric conversion elements one by one, there is a problem that a high-density array of thermoelectric conversion elements is difficult, and therefore the output that can be taken from the module is small.

The present invention is intended to solve the above-described conventional problems. In particular, it is an object of the present invention to provide a thermoelectric conversion element module which is easy to be manufactured, and in which a high-density arrangement and high connection reliability can easily achieved. And further, it is an object of the present invention to provide a method of manufacturing such a thermoelectric conversion element module.

Solution to Problem

In order to attain the above-described object, the present invention provides the following thermoelectric conversion element module.

(1) A thermoelectric conversion element module comprising: a thermoelectric conversion element group provided with a plurality of thermoelectric conversion element columns arranged in parallel, each column including P-type thermoelectric conversion elements and N-type thermoelectric conversion elements alternately arranged in a first direction;

a first connection electrode which arranged on one end face P and side portion of P-type thermoelectric conversion element and on one end face N and side portion of an N-type thermoelectric conversion element, the P-type thermoelectric conversion element and the N-type thermoelectric conversion element being adjacent to each other and constituting an outermost column among the columns, and the first connection electrode electrically connecting the one end face P with the one end face N; and a second connection electrode that electrically connects one end face of a P-type thermoelectric conversion element with one end face of an N-type thermoelectric conversion element in a second direction crossing the first direction.

(2) The thermoelectric conversion element module according to (1), wherein:

the P-type thermoelectric conversion element comprises a tube P made of a heat-resistant insulating material and a P-type thermoelectric conversion material filling the interior of the tube P, and the N-type thermoelectric conversion element comprises a tube N made of a heat-resistant insulating material and an N-type thermoelectric conversion material filling the interior of the tube N.

(3) The thermoelectric conversion element module according to (1), wherein:

the P-type thermoelectric conversion elements and the N-type thermoelectric conversion elements are arranged in a zigzag arrangement.

(4) The thermoelectric conversion element module according to (3), wherein:

the thermoelectric conversion element group includes a sequence in which the P-type thermoelectric conversion elements and the N-type thermoelectric conversion elements are arranged in "P-type-P-type-N-type-N-type" along the second direction.

Furthermore, the present invention provides the following method of manufacturing a thermoelectric conversion element module.

(5) A method of manufacturing a thermoelectric conversion element module, comprising:

a first step of preparing a thermoelectric conversion element group provided with a plurality of thermoelectric conversion element columns arranged in parallel, each column including P-type thermoelectric conversion elements and N-type thermoelectric conversion elements alternately arranged in a first direction;

a second step of forming a connection electrode layer which covers one end face P and a side portion of the P-type thermoelectric conversion elements and which covers one end face N and a side portion of the N-type thermoelectric conversion element;

a third step of patterning the connection electrode layer so as to cut off between the P-type thermoelectric conversion elements and the N-type thermoelectric conversion elements along a second direction crossing the first direction; and a fourth step of patterning the connection electrode layer so as to cut off along the first direction between sets, each set composed of the P-type thermoelectric conversion element and the N-type thermoelectric conversion element neighboring each other in the second direction.

(6) The method of manufacturing a thermoelectric conversion element module according to (5), further comprising a step of preparing a plurality of P-type thermoelectric conversion elements, each comprising a tube P made of a heat-resistant insulating material filled with a P-type thermoelectric conversion material, and a plurality of N-type thermoelectric conversion elements, each comprising a tube N made of a heat-resistant insulating material filled with an N-type thermoelectric conversion material, wherein:

the first step comprises:

step A of alternately arranging the P-type thermoelectric conversion elements and the N-type thermoelectric conversion elements along a first direction to form a first thermoelectric conversion element column in which the tubes of the elements are in parallel with each other;

step B of applying an adhesive to a peripheral surface of the P-type thermoelectric conversion element and a peripheral surface of the N-type thermoelectric conversion element of the first thermoelectric conversion element column;

step C of alternately arranging the P-type thermoelectric conversion elements and the N-type thermoelectric conversion elements along the first direction to form a second thermoelectric conversion element column in which the tubes of the elements are in parallel with each other, the second thermoelectric conversion element column being disposed on the first thermoelectric conversion element column via the applied adhesive; and step D of repeating step B and step C so as to obtain a thermoelectric conversion element group.

(7) The method of manufacturing a thermoelectric conversion element module according to (6), further comprising:

step E of cutting the thermoelectric conversion element group so as to divided into a plurality of thermoelectric conversion element groups.

(8) The method of manufacturing a thermoelectric conversion element module according to (6), wherein:

the P-type thermoelectric conversion element or the N-type thermoelectric conversion element of the second thermoelectric conversion element column is disposed on the first thermoelectric conversion element column and between the P-type thermoelectric conversion element and the N-type thermoelectric conversion element of the first thermoelectric conversion element column.

The above-described manufacturing method can easily realize a thermoelectric conversion element with high connection reliability and high-density array.

Advantageous Effects of Invention

As described above, according to the thermoelectric conversion element module (hereinafter also referred to as "module") and method of manufacturing the module according to the present invention, it is possible to provide a thermoelectric conversion element facilitating a high-density array, offering high connection reliability. And also such a module is easy to be manufactured.

DESCRIPTION OF EMBODIMENTS

Hereinafter, an embodiment of the present invention will be described with reference to the accompanying drawings.

(Regarding Thermoelectric Conversion Element)

Figure 1:
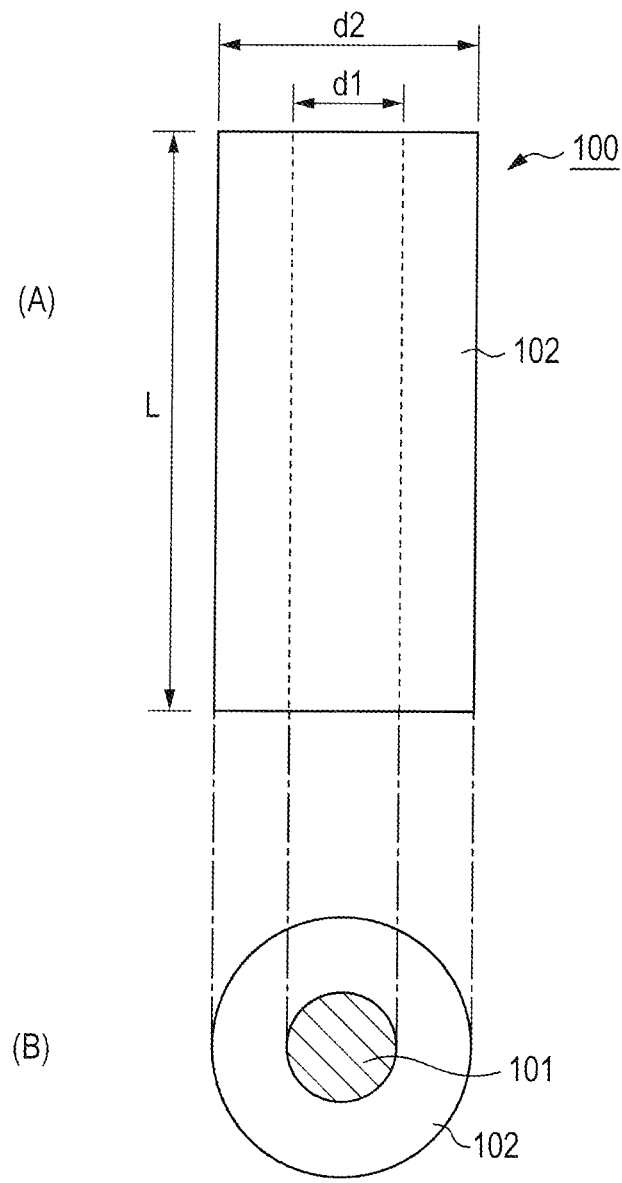
FIG. 1 is a diagram illustrating a thermoelectric conversion element according to the present invention.

FIG. 1 shows thermoelectric conversion element 100 according to Embodiment 1 of the present invention. FIG. 1(A) is a side view of thermoelectric conversion element 100 and FIG. 1(B) is a bottom view of thermoelectric conversion element 100. In FIG. 1, reference numeral 101 denotes a thermoelectric conversion material and numeral 102 denotes a tube made of a heat-resistant insulating material. Thermoelectric conversion material 101 has close contact with an inner wall surface of tube 102 and fills the interior of tube 102. For example, overall length L of thermoelectric conversion element 100 can be 1.0 to 3.0 mm and inner diameter d1 of tube 102 can be 1.8 mm and outer diameter d2 of tube 102 can be 3 mm.

Thermoelectric conversion material 101 is a material which generates an electromotive force when a temperature difference is provided between both ends thereof. Thermoelectric conversion material 101 can be selected according to a temperature difference produced when used. Examples of thermoelectric conversion element material 101 include a bismuth-tellurium-based (Bi—Te-based) material when the temperature difference ranges from a room temperature to 500 K, lead-tellurium-based (Pb—Te-based) material when the temperature difference ranges from a room temperature to 800 K and silicon-germanium-based ((Si—Ge-based) material when the temperature difference ranges from a room temperature to 1000 K.

The P-type thermoelectric conversion material and N-type thermoelectric conversion material can be obtained, for example, by adding an appropriate dopant to the thermoelectric conversion material. An example of the dopant to obtain the P-type thermoelectric conversion material is Sb. An example of the dopant to obtain the N-type thermoelectric conversion material is Se. By adding these dopants, the thermoelectric conversion materials form a mixed crystal. Therefore, these dopants are added to the thermoelectric conversion materials on the order of amount according to compositional formulas of thermoelectric conversion materials such as "$Bi_{0.5}Sb_{1.5}Te_3$" and "$Bi_2Te_{2.7}Se_{0.3}$."

Tube 102 is made of a heat-resistant and insulating material. Tube 102 has heat resistance stably keeping its shape even at a maximum temperature under environment in which a thermoelectric conversion element is used or at a melting point of the thermoelectric conversion material. Furthermore, tube 102 has insulating properties for breaking an electric current of thermoelectric conversion material 101. Tube 102 is preferably a circular tube from the point of arranging the thermoelectric conversion elements at a high density in the module. Examples of the material of tube 102 include metal oxide such as silica, alumina, or heat-resisting glass like quartz. The material of tube 102 is preferably quartz from the point of heat resistance and is further preferably heat-resisting glass in consideration of cost.

(Regarding Thermoelectric Conversion Element Manufacturing Method)

The step of manufacturing thermoelectric conversion element 100 in FIG. 1 will be described with reference to FIG. 2.

First, tube 1020 made of a heat-resistant insulating material will be prepared as shown in FIG. 2(a). Tube 102 is obtained by cutting tube 1020. The material of tube 1020 is glass, and is preferably heat-resisting glass (a kind of borosilicate glass which is a mixture of $SiO_2$ and $B_2O_3$, a material having a coefficient of thermal expansion of approximately $3 \times 10^{-6}$/K). The material generally known as heat-resisting glass is Pyrex (registered trademark) glass manufactured by Corning Incorporated. Tube 1020 has an overall length of 150 mm, inner diameter d1 of 1.8 mm and outer diameter d2 of 3 mm.

Next, one end of tube 1020 in FIG. 2(a) is heated and burnt using a burner so as to be closed (see part shown by a broken line in FIG. 2(b)).

After that, powdered or micro-chipped thermoelectric conversion material 101 is charged into tube 1020 through the opened end opposite to the closed end of tube 1020. After adjusting its composition beforehand, thermoelectric conversion material 101 is crushed so as to be adjusted to a size such that the crushed material can be charged into the interior space of tube 1020. Thermoelectric conversion material 101 is, for example, a $Bi_2Te_3$-based material.

Figure 2:
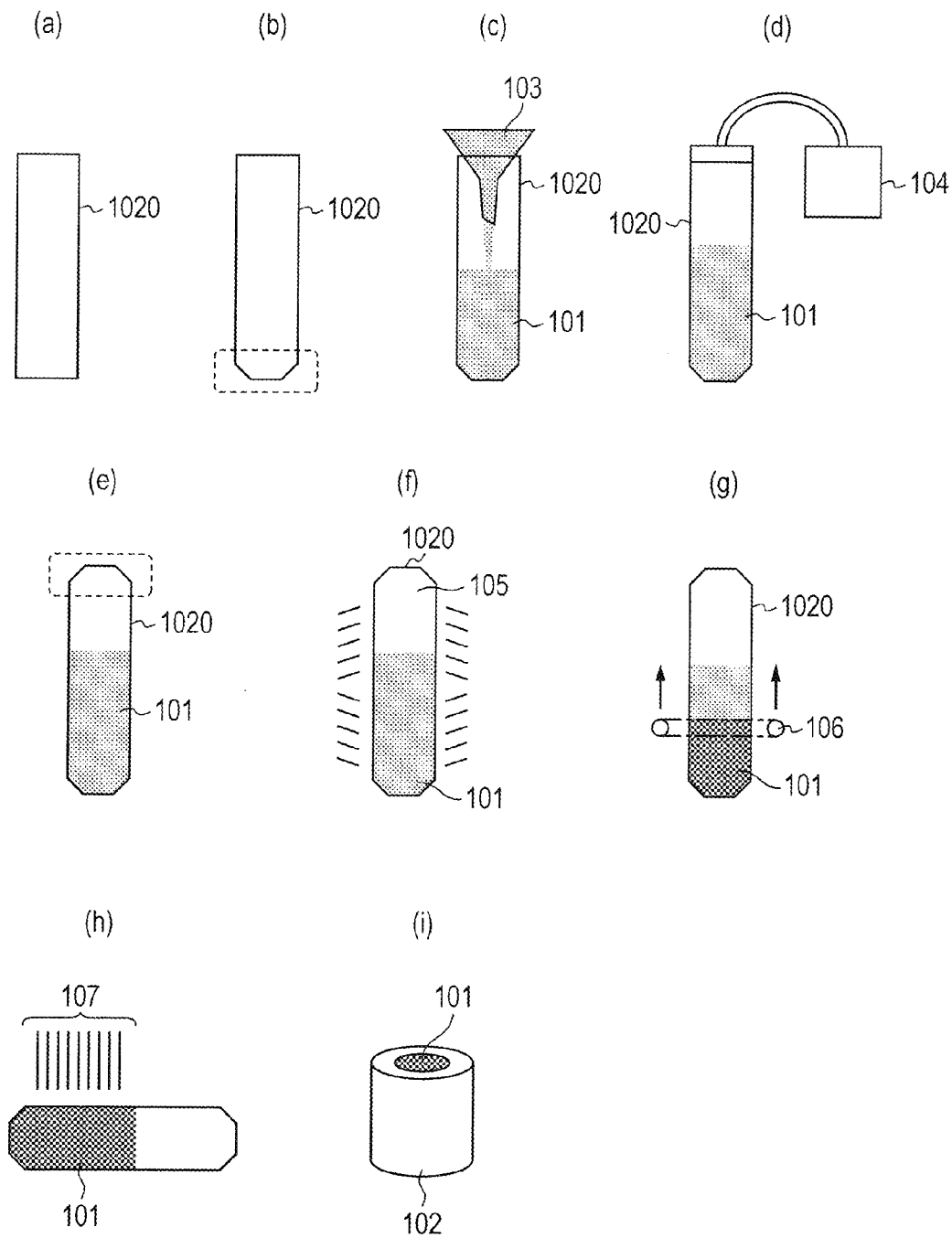
FIG. 2 is a diagram illustrating an overview of manufacturing steps of the thermoelectric conversion element of the present invention.

As shown in FIG. 2(*c*), thermoelectric conversion material 101 is injected in funnel 103 placed at the opening of tube 1020, and then is charged into tube 1020 by applying microvibration to tube 1020 or/and funnel 103. Thermoelectric conversion material 101 is charged, for example, up to substantially the middle of the length of tube 1020 as shown in FIG. 2(*c*).

Then, as shown in FIG. 2(*d*), the pressure inside tube 1020 is reduced with vacuum pump 104 connected to the opening of tube 102. And then, the opening of tube 1020 is heated so as to soften using a burner, whereby the opening is closed (see an area shown by a broken line in FIG. 2(*e*)). Then, tube 1020 charged with thermoelectric conversion material 101 is accommodated in a furnace (not shown). In the furnace, tube 1020 is accommodated in a standing position. Temperature of tube 1020 is kept under a condition of, for example, approximately 700 degrees Celsius for approximately 30 minutes (FIG. 2(*f*)). Under the above-described condition, thermoelectric conversion material 101 in tube 1020 is melted and liquefied so as to be settled in the lower part of tube 1020. By accommodating tube 1020 charged with thermoelectric conversion material 101 in the furnace, thermoelectric conversion material 101 can be made to fill the interior (lower part) of tube 1020.

The volume of thermoelectric conversion material 101 after the melting becomes smaller than before the melting. For this reason, the space not charged with thermoelectric conversion material 101 inside tube 1020 becomes greater. Therefore, tube 1020 preferably includes in the tube, buffer section 105 which is a space enough to allow for such a spatial fluctuation of thermoelectric conversion material 101. Tube 1020 provided with appropriate buffer section 105 brings about an effect of preventing tube 1020 itself from being cracked by thermal stress when tube 1020 is heated.

Then, tube 1020 charged with thermoelectric conversion material 101 is cooled inside the furnace or by taking tube 1020 out of the furnace. Next, heater 106 which is placed outside tube 1020 is moved from the lower part to the upper part of tube 1020 at a predetermined speed as shown in FIG. 2(*g*). Through such an operation, the heating position of tube 1020 is changed at a constant speed, and thereby the crystal orientation of thermoelectric conversion material 101 is aligned in one direction. The moving speed of heater 106 is preferably on the order of 25 to 30 mm/h.

Then, as shown in FIG. 2(*h*), tube 1020 charged with thermoelectric conversion materials 101 whose crystal orientation is aligned is cut using wire saw 107 along direction perpendicular to the longitudinal direction of tube 1020. It is thus possible to obtain thermoelectric conversion element 100 comprising tube 102 and thermoelectric conversion material 101 filling the interior of tube 102 (FIG. 2(*i*)).

Through the above-described manufacturing steps of the thermoelectric conversion element, thermoelectric conversion material 101 filling tube 102 can be closely contact with the inner wall surface of tube 102. For this reason, it is possible to suppress "cracking" or "chipping" which may generates a problem upon cutting thermoelectric conversion material 101. Therefore, it is possible to provide a thermoelectric conversion element with high reliability. Furthermore, tube 102 acts as a spacer in an array in which individual thermoelectric conversion elements 100 are arranged at a high density. Thus, it is also possible to easily obtain a high-density array of thermoelectric conversion elements.

The present embodiment has described an embodiment in which the thermoelectric conversion material is charged into one tube 1020, but a plurality of tubes 1020 filled with the thermoelectric conversion material may also be manufactured simultaneously.

Figure 7:
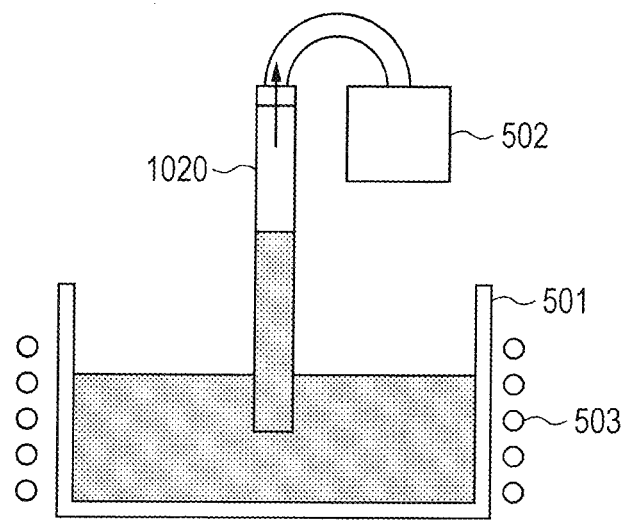
FIG. 7 is a diagram illustrating an overview of a manufacturing step of the thermoelectric conversion element of the present invention (modification example).

Furthermore, the above-described embodiment has described the steps of: heating thermoelectric conversion material 101 charged into tube 1020 in the furnace (FIG. 2(*f*)); and then reheating it using heater 106 (FIG. 2(*g*)). To charge thermoelectric conversion material 101 into tube 1020, for example, a method as shown in FIG. 7 may be used. In the method, one end of tube 1020 is immersed in a melted thermoelectric conversion material at approximately 700 degrees Celsius in tank 501 equipped with heater 503. And the thermoelectric conversion material is suctioned up into tube 1020 using vacuum pump 502 connected to the other end of tube 1020.

When thermoelectric conversion material 101 is charged into tube 1020 using this method, crystal orientation of thermoelectric conversion material 101 is aligned in one direction while moving of the thermoelectric conversion material inside tube 1020 by the suctioning. Thus, the method shown in FIG. 7 has an advantage of being able to omit the step shown in FIG. 2(*g*).

(Regarding Thermoelectric Conversion Element Module)

Figure 3:
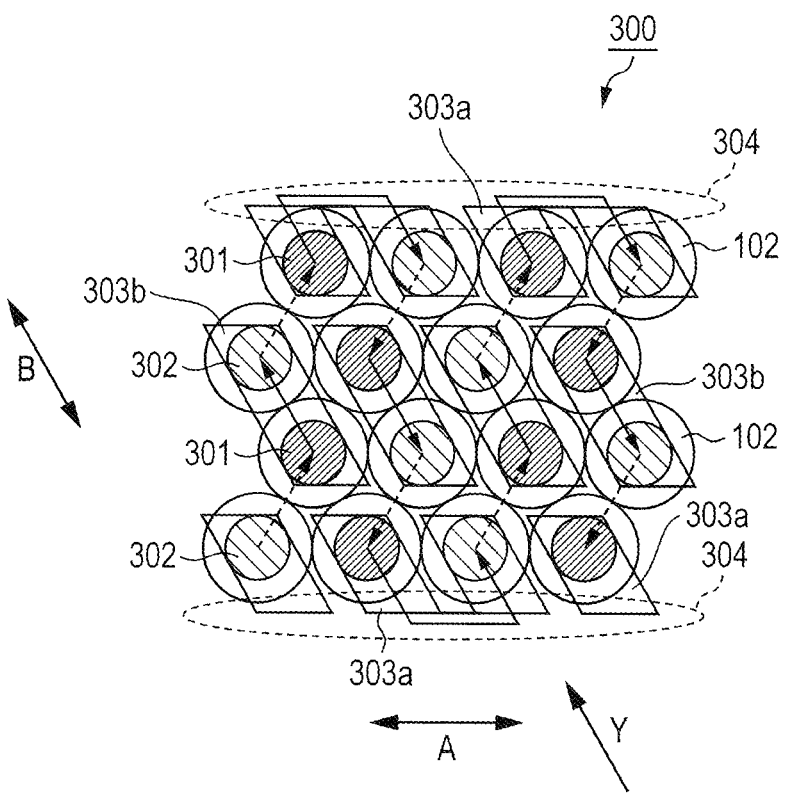
FIG. 3 is a diagram illustrating an array of a thermoelectric conversion element module of the present invention.
Figure 3:
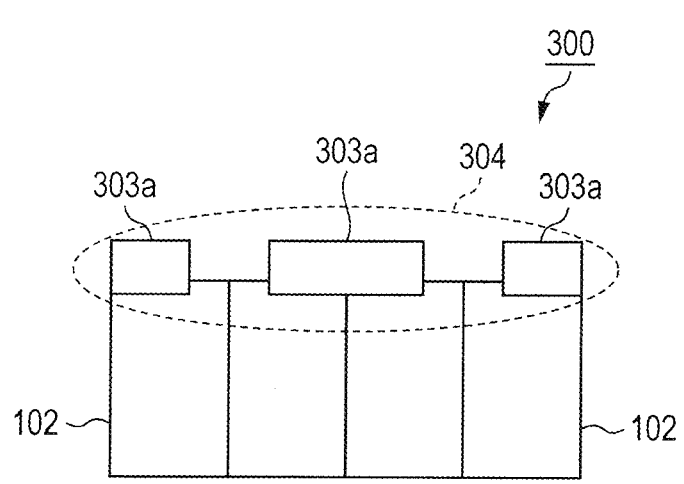

FIG. 3 is a schematic view of thermoelectric conversion element module 300 according to the embodiment of the present invention. FIG. 3(A) is a plan view of module 300 viewed from above. FIG. 3(B) is a side view of module 300 viewed from a direction indicated by arrow Y in FIG. 3(A).

Thermoelectric conversion element module 300 can be obtained by assembling a plurality of aforementioned thermoelectric conversion elements 100 so as to form a thermoelectric conversion element group (hereinafter also referred to as "element group"), and by electrically connecting between thermoelectric conversion elements 100 via connection electrodes.

The element group includes a plurality of P-type thermoelectric conversion elements (hereinafter also referred to as "P-type elements") and a plurality of N-type thermoelectric conversion elements (hereinafter also referred to as "N-type elements"). In FIG. 3, reference numeral 301 denotes a P-type thermoelectric conversion material and 302 denotes an N-type thermoelectric conversion material. The P-type element comprises tube 102 and P-type thermoelectric conversion material 301 filling the interior of tube 102. The N-type element comprises tube 102 and N-type thermoelectric conversion material 302 filling the interior of tube 102. The element group is configured by arranging a plurality of thermoelectric conversion element columns in parallel. The thermoelectric conversion element column is configured by alternately arranging the P-type elements and the N-type elements along a first direction. In FIG. 3(A), arrow A indicates the first direction. In the element group shown in FIG. 3, thermoelectric conversion elements are arranged in a zigzag arrangement.

In FIG. 3, reference numeral 303*a* denotes a connection electrode. Connection electrode 303*a* electrically connects one end face of the P-type element with one end face of the N-type element along the direction indicated by arrow A. Alternatively, connection electrode 303*a* electrically connects the other end face of P-type element with the other end face of the N-type element along the direction indicated by arrow A. Connection electrode 303*a* is also arranged at a side portion 304 of the element group. Here, both of the elements constitute the outermost thermoelectric conversion element column. The "outermost thermoelectric conversion element column" is an end column of the element group in a direction in which thermoelectric conversion element columns are arranged in parallel, the end column constituting side portions 304 of the element groups. Side portion 304 is, for example, a side edge and a side surface of the element group. The connection electrode 303a corresponding to the first connection electrode can include protrusion from the side edge of the element group (e.g., bent portion 303c and flange 303f in FIG. 5).

In FIG. 3, reference numeral 303b denotes a connection electrode. Connection electrode 303b electrically connects one end face of the P-type element with one end face of the N-type element along a direction indicated by arrow B inclined with respect to the direction indicated by arrow A. Alternatively, connection electrode 303b electrically connects the other end face of the P-type element with the other end face of the N-type element along a direction indicated by arrow B inclined with respect to the direction indicated by arrow A. Connection electrode 303b corresponds to the second connection electrode, and the direction indicated by arrow B corresponds to the second direction.

Connection electrode 303a has a portion P on end surface of the P-type element, a portion N on end surface of the N-type element, and a portion on peripheral portion of both elements which connects the portion P with the portion N. Connection electrode 303b has a parallelogram shape having two sides parallel to the direction indicated by arrow A and two sides parallel to the direction indicated by arrow B.

The end face of the thermoelectric conversion element comprises: the end face of P-type or N-type thermoelectric conversion material 301 or 302; and the end face of tube 102. Connection electrode 303a is bonded to the end face of P-type or N-type thermoelectric conversion material 301 or 302, and the end face and the side edge of tube 102. On the other hand, connection electrode 303b is bonded to the end face of P-type or N-type thermoelectric conversion material 301 or 302 and the end face of tube 102. Here, connection electrodes 303a and 303b are bonded not only to the end face of P-type or N-type thermoelectric conversion material 301 or 302 but also to the end face of tube 102. Thus, when the module is used as a power generator, for example, reliability with respect to thermal stress improves more. This is because when contact electrodes 303a and 303b come into contact with a high-temperature part, thermal stress generated at contact electrodes 303a and 303b can be received at the contact area which is greater than that of the conventional thermoelectric conversion element. As described above, in the conventional thermoelectric conversion element, the connection electrode is bonded to only the end face of the thermoelectric conversion material.

Furthermore, as shown in FIG. 3(A), module 300 includes an array in which the P-type elements and the N-type elements are arranged in a sequence of P-type-P-type-N-type-N-type along the second direction. In the first direction (arrow A in FIG. 3(A)), P-type thermoelectric conversion materials 301 and N-type thermoelectric conversion materials 302 are alternately arranged. In contrast, in the second direction (arrow B in FIG. 3(A)), they are arranged as P-P-N-N. Thus, connection electrodes 303a and 303b can be formed in a straight line state on the end faces of the element group. Thus, the element group includes the array in which the P-type elements and the N-type elements are arranged in a sequence of P-type-P-type-N-type-N-type along the second direction, and it is thereby possible to increase the widths of connection electrodes 303a and 303b, suppress loss by inner resistance and improve power generation efficiency of the module.

The present embodiment has described the embodiment in which the P-type elements and the N-type elements are arranged alternately as "P-N-P-N-" along the first direction, but the "alternate arrangement" in the present invention also includes embodiments in which the same number of P-type elements and N-type elements are alternately arranged along the first direction as "P-P-N-N-P-P-N-N-" and "P-P-P-N-N-N-P-P-P-N-N-N-." Furthermore, the present invention also includes embodiments in which the same number of P-type elements and N-type elements are alternately arranged along the first direction in some of thermoelectric conversion element columns. When a plurality of P-type elements and a plurality of N-type elements are alternately arranged, the connection electrodes are formed so that the plurality of P-type elements and the plurality of N-type elements are electrically connected each other.

Arrows of solid lines/broken lines connecting between the thermoelectric conversion elements in FIG. 3(A) indicate current flows in one end face/the other end face, respectively. Hereinafter, "one end face/the other end face" are also referred to as "top surface/undersurface" of module 300 or thermoelectric conversion element group. To be more specific, the solid line arrow indicates a current flow between neighboring thermoelectric conversion elements in the top surface. On the other hand, the broken line arrow indicates a current flow between neighboring thermoelectric conversion elements in the undersurface.

(Regarding Method of Manufacturing Thermoelectric Conversion Element Module)

Hereinafter, the method of manufacturing module 300 when a plurality of thermoelectric conversion elements are arranged in a zigzag arrangement will be described with reference to FIG. 4. This manufacturing method includes:

a first step of preparing a thermoelectric conversion element group;

a second step of forming a connection electrode layer that covers one or both of a top surface and an undersurface of the thermoelectric conversion element group and a side portion of the thermoelectric conversion element group;

a third step of patterning the connection electrode layer so as to cut off between the P-type elements and the N-type elements along a second direction, the connection electrode layer formed on one or both of the top surface and the undersurface of the thermoelectric conversion element group; and a fourth step of patterning the connection electrode layer so as to cut off along the first direction between sets, each set composed of the P-type element and N-type element neighboring each other along the second direction.

(First Step)

Hereinafter, the first step will be described. This first step includes:

step A of alternately arranging the P-type elements and the N-type elements along the first direction to form a first thermoelectric conversion element column in which the elements are in parallel each other;

step B of applying an adhesive to a peripheral surface of the P-type element and a peripheral surface of the N-type element of the first thermoelectric conversion element column;

step C of alternately arranging the P-type elements and the N-type elements along the first direction to form a second thermoelectric conversion element column in which the elements are in parallel each other, the second thermoelectric conversion element column being disposed on the first thermoelectric conversion element column via the applied adhesive;

step D of repeating step B and step C to obtain a thermoelectric conversion element group; and, step E of cutting the thermoelectric conversion element group so as to divided into a plurality of thermoelectric conversion element groups, the cutting being along a direction crossing the axes of the elements.

As shown in FIG. 4(a), base 401 of Teflon (registered trademark) resin is prepared first. Furthermore, P-type element 102p obtained by charging a P-type thermoelectric conversion material into tube 1020 and N-type element 102n obtained by charging an N-type thermoelectric conversion material into tube 1020 are prepared. P-type element 102p and N-type element 102n are prepared using the method shown in FIG. 2 or the method shown in FIG. 7.

(Step A)

Next, heat-resistant adhesive 402 is applied to the surface of base 401 (FIG. 4(b)). Then, as shown in FIG. 4(c), positioning block 403 of Teflon (registered trademark) resin is placed on one end side of base 401. P-type elements 102p and N-type elements 102n are alternately arranged on the surface of base 401 in one direction and in a manner so as to contact each other. The "one direction" corresponds to the first direction. Thus, first thermoelectric conversion element column 404a is formed on base 401.

(Step B)

Next, as shown in FIG. 4(d), heat-resistant adhesive 402 is applied to the surface of first thermoelectric conversion element column 404a. Heat-resistant adhesive 402 is applied so as to cover the substantially entire surface of first thermoelectric conversion element column 404a.

(Step C)

Next, P-type elements 102p and N-type elements 102n are arranged alternately on first thermoelectric conversion element column 404a along the first direction. Thus, second thermoelectric conversion element column 404b is formed on first thermoelectric conversion element column 404a (FIG. 4(e)). P-type element 102p and N-type element 102n constituting second thermoelectric conversion element column 404b are disposed between P-type element 102p and N-type element 102n constituting first thermoelectric conversion element column 404a, respectively.

(Step D)

By alternately repeating an application of heat-resistant adhesive 402 to the surface of the thermoelectric conversion element column and an arrangement of a further thermoelectric conversion element column on the thermoelectric conversion element column to which the adhesive is applied, a plurality of thermoelectric conversion element columns are stacked one on another (FIG. 4(f)). After stacking a predetermined number of thermoelectric conversion element columns, heat-resistant adhesive 402 is cured so as to integrate them into one assembly which comprises conversion element group 405.

Figure 4:
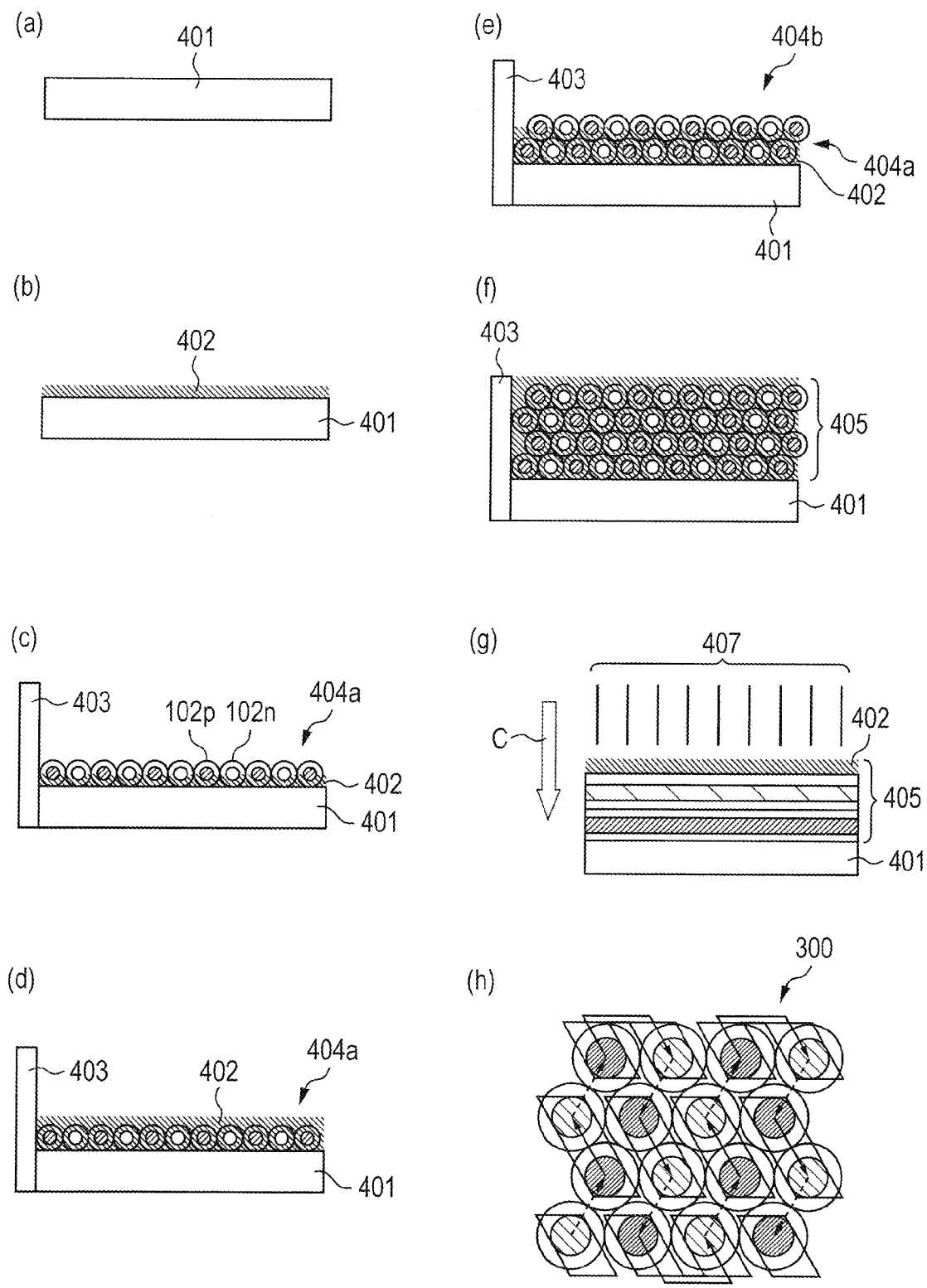
FIG. 4 is a diagram illustrating manufacturing steps of the thermoelectric conversion element module of the present invention.

FIG. 4 shows group 405 in which four thermoelectric conversion element columns are stacked one on another, but normally, more thermoelectric conversion element columns are stacked one on another. According to the method of stacking thermoelectric conversion element columns shown in FIG. 4, P-type elements 102p and N-type elements 102n are arranged in a zigzag arrangement.

(Step E)

Next, positioning block 403 is removed from base 401, element group 405 is cut with wire saw 407 and the like to a predetermined thickness (FIG. 4(g)). The cut is conducted along a direction crossing the axes of P-type elements 102p and N-type elements 102n. In particular, the cutting direction is parallel to the sheet surface in FIG. 4(g) as indicated by arrow C in FIG. 4(g). As a result, a plurality of the element groups can be obtained. The element groups have a structure in which a plurality of thermoelectric conversion element columns are arranged in parallel, each column comprising P-type elements and N-type elements alternately arranged along the first direction.

By forming connection electrodes 303a and 303b on the element group prepared in this way, module 300 is obtained (FIG. 4(h)).

Next, the method of forming connection electrodes 303a and 303b will be described in detail.

(Second Step)

Figure 5:
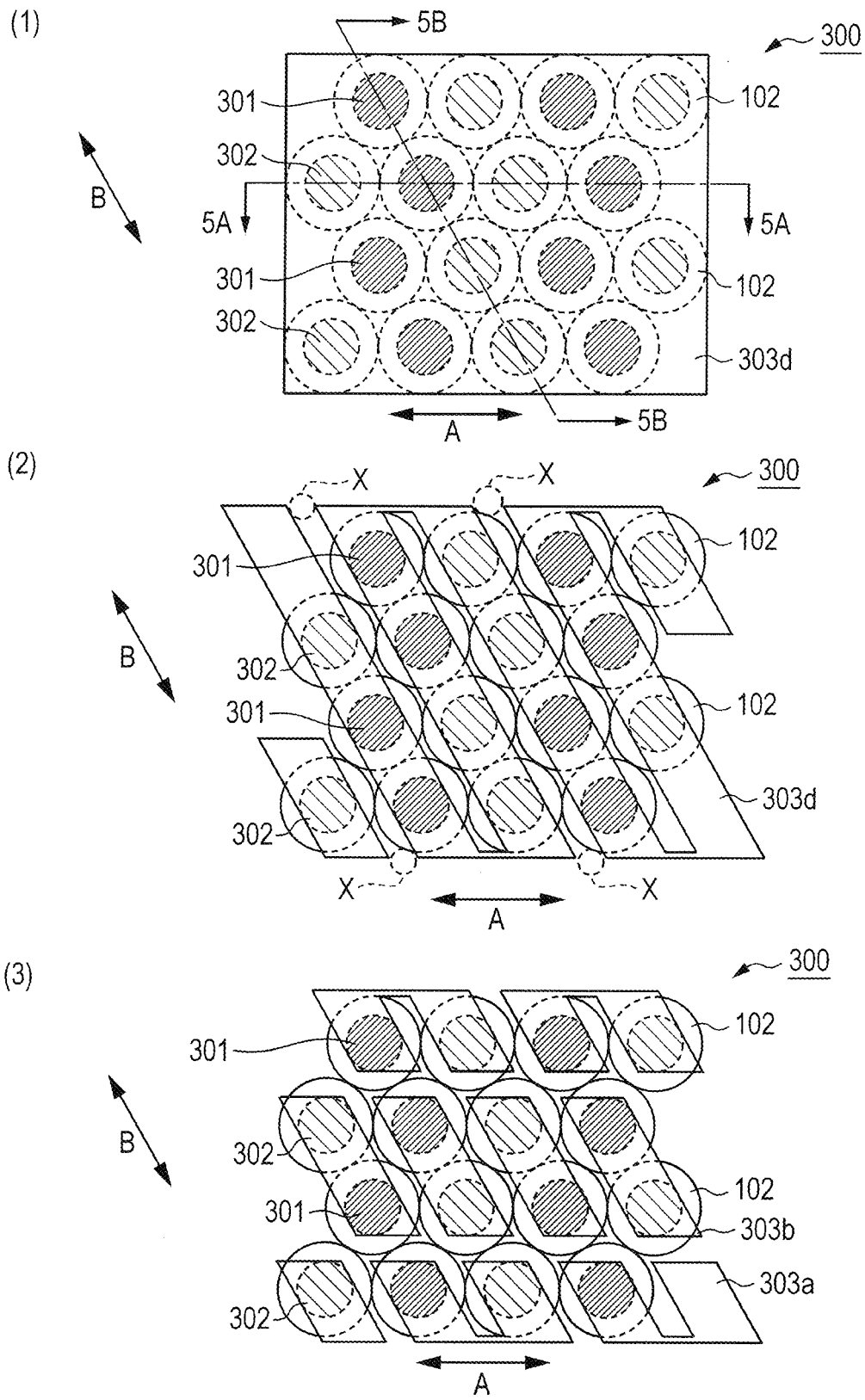
FIG. 5 is a diagram illustrating a method of forming the connection electrode in the thermoelectric conversion element module of the present invention (1).
Figure 6:
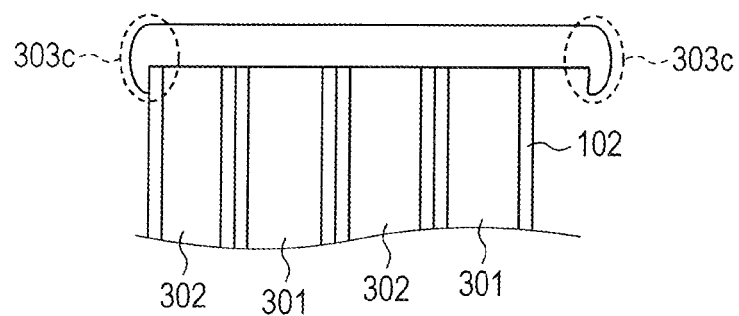
FIG. 6 is a diagram illustrating a method of forming the connection electrode in the thermoelectric conversion element module of the present invention (2).
Figure 6:
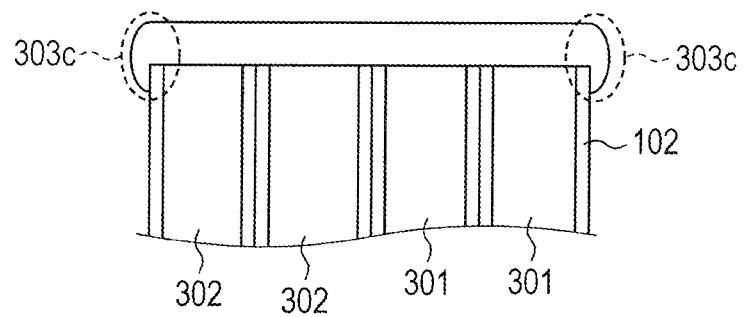
Figure 6:
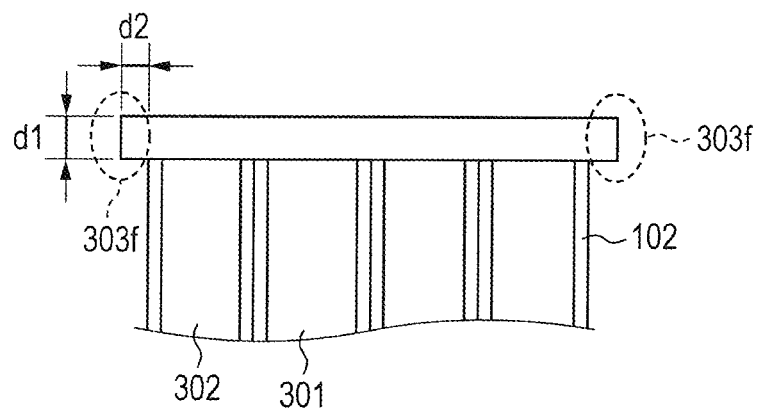

First, as shown in FIG. 5(1), connection electrode layer 303d made of connection electrode material having a predetermined thickness is formed on the surface (top surface) of the element group. Examples of the material of the connection electrode include copper, nickel, aluminum, zinc alloy, and copper alloy. Connection electrode layer 303d can be formed through plating, vapor deposition, sputtering or thermal spraying, for example. The thickness of connection electrode layer 303d is normally 100 nm to 3 um. FIG. 6(A) shows cross section 5A-5A in FIG. 5(1) and FIG. 6(B) shows cross section 5B-5B in FIG. 5(1).

As shown in FIG. 6(A) and FIG. 6(B), an bent portion 303c of connection electrode layer 303d is bent downward at the edge of module 300. Thus, connection electrode layer 303d covers both of the top surface or the undersurface and the side portion of the element group.

(Third Step)

Connection electrode layer 303d is patterned so as to cut off between the thermoelectric conversion elements along the second direction (direction indicated by arrow B in FIG. 5(1)). Connection electrode layer 303d can be cut, for example, through etching. Furthermore, connection electrode layer 303d can be cut using, for example, a wire saw or disk blade. Connection electrode layer 303d has a shape shown in FIG. 5(2). Neighboring two connection electrode layers 303d in FIG. 5(2) are connected each other via bent portion 303c on side portion of the element group (FIG. 6(B)).

The connection electrode layer 303d is formed using a mask disposed on the surface of the element group, so as not to electrically connect neighboring two connection electrode layers 303d with each other (e.g., notch X in FIG. 5(2)). Notch X can be formed at a desired position using the mask. The method of forming connection electrode layer 303d including notch X can comprise etching connection electrode layer 303d via a mask after forming connection electrode layer 303d on the surface of the element group.

(Fourth Step)

Next, as shown in FIG. 5(3), connection electrode layer 303d is patterned so as to cut off along the first direction (direction indicated by arrow A in FIG. 5(3)) between sets, the set composed of P-type element and N-type element. Through this cutting, neighboring two P-type element and N-type element are electrically connected along the direction indicated by arrow A; and at other position, neighboring two P-type element and N-type element are electrically connected along the direction indicated by arrow B. Desired connection electrodes 303a and 303b can be formed on the top surface of the element group in this way.

Though not shown, desired connection electrodes 303a and 303b can also be formed on the undersurface of the element group by forming and patterning connection electrode layer 303d as described above. Thus, all P-type elements and N-type elements of the element group are electrically connected in series.

The present embodiment has described the method of using a layer of the connection electrode material formed through plating on the surface of the element group, for example, but the present invention is not limited to this. For example, it may be possible to arrange and cut connection electrode member 303e instead of the layer of the connection electrode material for forming connection electrodes 303a and 303b. FIG. 6(C) is a diagram illustrating a cross section when the element group including connection electrode member 303e is cut along line B-B in FIG. 5(1). Connection electrode member 303e is a plate of copper, nickel, aluminum, zinc alloy or copper alloy, for example. In this case, as shown in FIG. 6(C), protruding length d2 of flange 303f that protrudes from the side edge of the element group is made to be greater than thickness d1 of connection electrode member 303e. By not cutting but remaining flange 303f, the neighboring two P-type element and N-type element can be electrically connected via flange 303f on the side portion of the element group.

When a layer of the connection electrode material is formed on the entire surface of the element group with surface plating and the like, it may be possible to further include a step of patterning the layer of the connection electrode material that covers the side surface of the element group so as to remove the central part of the layer. The layer of the connection electrode material on the side surface may be removed by etching, for example.

Furthermore, although the present embodiment has described the method of performing the fourth step after the third step, the third step may be performed after the fourth step.

Since a heat-resistant insulating layer to which the connection electrode is attached is formed between the thermoelectric conversion materials in the module manufacturing step, it is possible to reduce thermal stress generated due to a temperature difference. Therefore, it is possible to realize a thermoelectric conversion element module capable of improving reliability against thermal stress.

Instead of aforementioned P-type elements 102p and N-type elements 102n, the element group may also be manufactured by bonding and stacking the P-type elements and N-type elements shown in FIG. 1 by the same method as described above. Thus, the element group can also be manufactured by bonding and stacking and by not cutting thermoelectric conversion elements having a desired length for thermoelectric conversion elements. But the method shown in FIG. 4 is preferable from the point of improving productivity of the module.

Arranging the thermoelectric conversion elements in a zigzag arrangement is preferable: from the point of increasing an arrangement density of the thermoelectric conversion elements; from the point of increasing structural stability of the element group; and from the point of easily stacking thermoelectric conversion element columns one on another. The present invention may also arrange the thermoelectric conversion elements in a grid arrangement. The element group having grid arrangement of thermoelectric conversion elements can be formed by: in the method shown in FIG. 4, arranging P-type elements and N-type elements of the second thermoelectric conversion element column right above the P-type elements and N-type elements of the first thermoelectric conversion element column.

Figure 8:
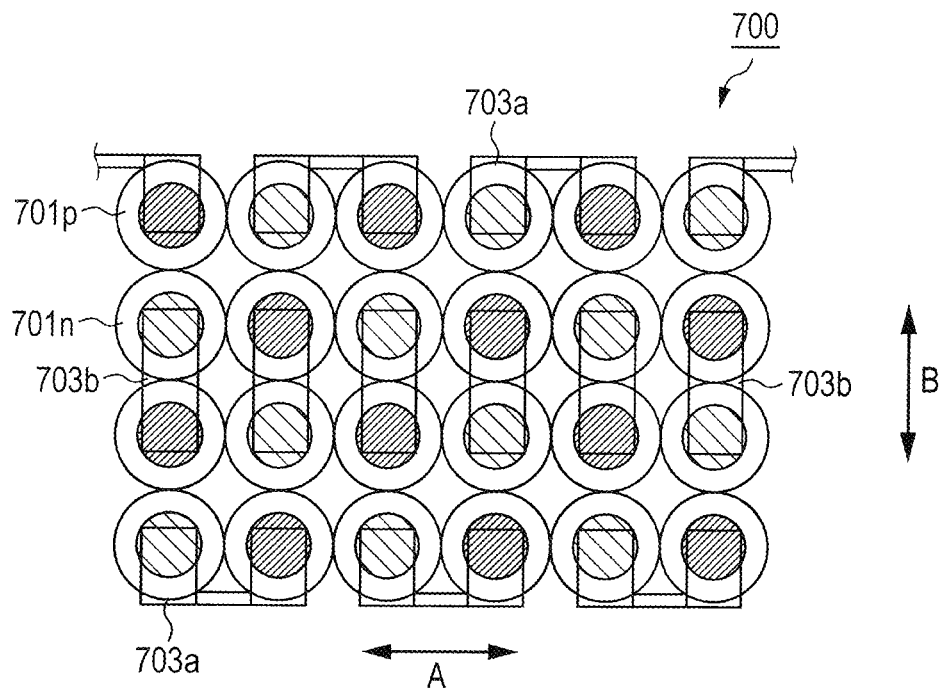
FIG. 8 is a diagram schematically illustrating an example of the thermoelectric conversion element module of the present invention.

For example, in thermoelectric conversion element module 700 having a grid arrangement shown in FIG. 8, P-type elements 701p and N-type elements 701n are alternately arranged along a direction in which the thermoelectric conversion element columns are arranged in parallel (direction indicated by arrow B in FIG. 8). This module 700 can be obtained through a method similar to that of aforementioned module 300, the method including forming connection electrodes 703a and 703b by assuming a direction orthogonal to the first direction (direction indicated by arrow A) as a second direction (direction indicated by arrow B).

Figure 9:
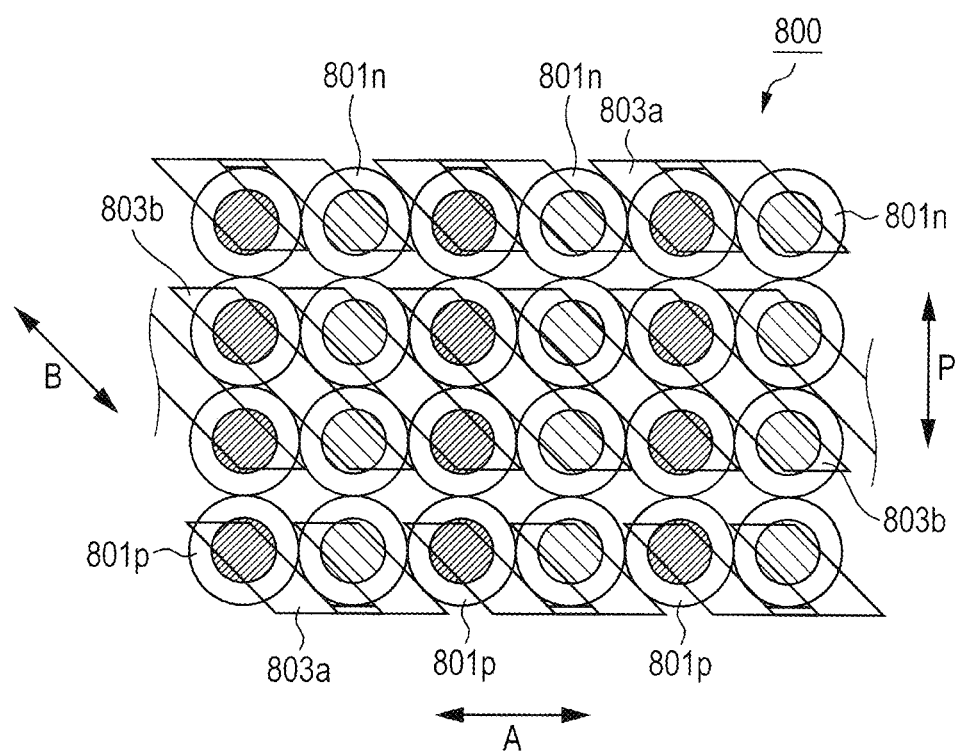
FIG. 9 is a diagram schematically illustrating another example of the thermoelectric conversion element module of the present invention.

Furthermore, in thermoelectric conversion element module 800 having a grid arrangement shown in FIG. 9, P-type elements 701p and N-type elements 701n are aligned along the direction in which the thermoelectric conversion element columns are arranged in parallel (direction indicated by arrow P in FIG. 9). This module 800 can be obtained through a method similar to that of aforementioned module 300, the method including forming connection electrodes 803a and 803b by assuming a direction inclined at an angle of 45 degrees with respect to the first direction (direction indicated by arrow A) as a second direction (direction indicated by arrow B).

Figure 10:
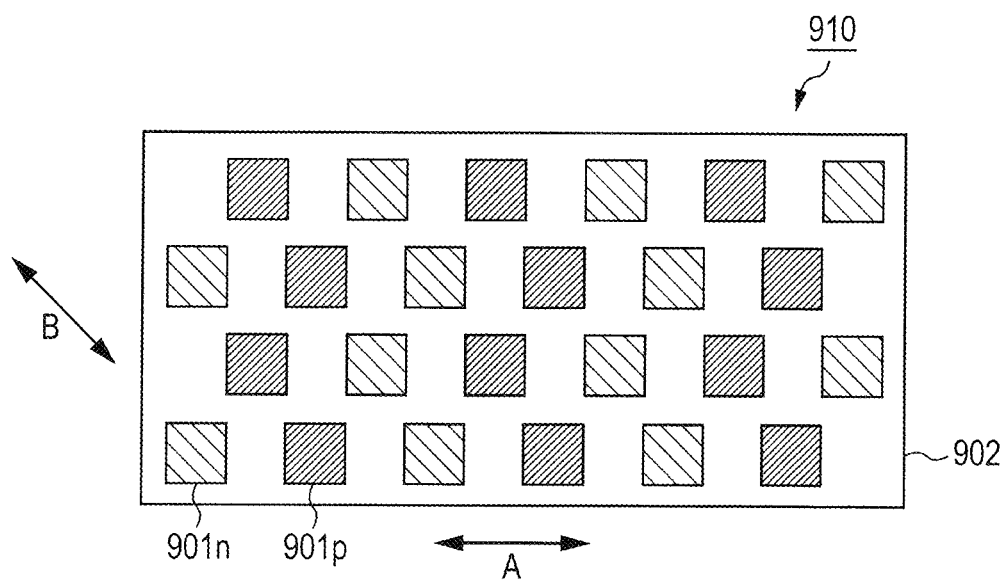
FIG. 10 is a diagram schematically illustrating another example of the thermoelectric conversion element group of the present invention.
Figure 11:
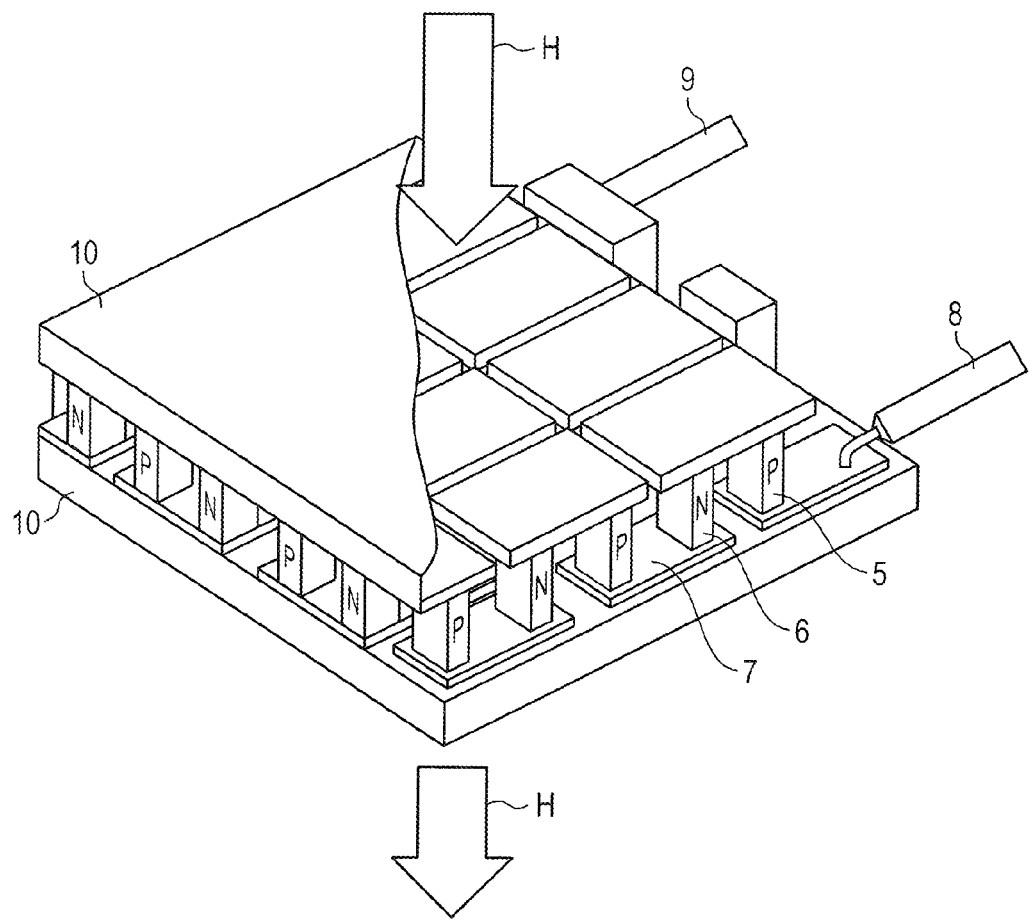
FIG. 11 is a schematic view illustrating a conventional thermoelectric conversion element module.

Furthermore, thermoelectric conversion element group 910 shown in FIG. 10 includes: P-type thermoelectric conversion materials 901p and N-type thermoelectric conversion materials 901n arranged in a zigzag arrangement; and fixing medium 902 that fixes the arrangement. P-type thermoelectric conversion materials 901p and N-type thermoelectric conversion materials 901n are formed through dicing of an ingot of the thermoelectric conversion materials, for example. Fixing medium 902 is, for example, silicone resin or epoxy resin. Such thermoelectric conversion element group 910 can be one embodiment of the present invention.

The module of the present invention has a series circuit of thermoelectric conversion elements including PN junction, the series circuit being connected with an external connection terminal. Further, the module of the present invention is connected with a power supply as required. The module of the present invention can be used for a power generator, the module being connected with an external connection terminal. Furthermore, the module of the present invention can be used for the electronic cooling element, the module being connected with an external connection terminal and a power supply. A plurality of the modules of the present invention may be electrically connected in series or in parallel in the power generator or the electronic cooling element.

The present application claims a priority based on Japanese Patent Application No. 2011-084267, filed on Apr. 6, 2011, the disclosure of which is incorporated herein by reference in its entirety.

INDUSTRIAL APPLICABILITY

As described so far, the present invention can realize a high-density array of thermoelectric conversion materials, and also can realize thermoelectric conversion elements and a thermoelectric conversion element module having element characteristics with high connection reliability. And further a manufacturing method thereof can be obtained. Therefore, the present invention is widely applicable to various devices in which heat needs to be converted directly to electricity.

REFERENCE SIGNS LIST 100 thermoelectric conversion element
101 thermoelectric conversion material
102, 1020 tube
102n, 701n, 801n, 901n N-type thermoelectric conversion element
102p, 701p, 801p, 901p P-type thermoelectric conversion element
103 funnel
104, 502 vacuum pump
105 buffer section 106, 503 heater
107, 407 wire saw
300, 700, 800 thermoelectric conversion element module
301 P-type thermoelectric conversion material
302 N-type thermoelectric conversion material
303a, 303b, 703a, 703b, 803a, 803b connection electrode
303c bent portion
303d connection electrode layer
303e connection electrode member
303f flange
304 side portion of thermoelectric conversion element group
401 base
402 heat-resistant adhesive
403 positioning block
404a first thermoelectric conversion element column
404b second thermoelectric conversion element column
405, 910 thermoelectric conversion element group
501 tank
902 fixing medium
A arrow indicating first direction in present invention
B arrow indicating second direction in present invention
C arrow indicating direction in which thermoelectric conversion element group 405 is cut
H arrow indicating heat flow direction
X notch

The invention claimed is:

1. A thermoelectric conversion element module comprising:
a thermoelectric conversion element group provided with a plurality of thermoelectric conversion element columns arranged in parallel, each column including: P-type thermoelectric conversion elements, each comprising a tube P made of a heat-resistant insulating material and a P-type thermoelectric conversion material filling an interior of the tube P, and N-type thermoelectric conversion elements, each comprising a tube N made of a heat-resistant insulating material and an N-type thermoelectric conversion material filling an interior of the tube N,
wherein the P-type thermoelectric conversion elements and the N-type thermoelectric conversion elements are alternately arranged in a first direction and in a manner so as to contact each other;
a first connection electrode arranged on one end face P and a side portion of one of the P-type thermoelectric conversion elements and on one end face N and a side portion of one of the N-type thermoelectric conversion elements, the one of the P-type thermoelectric conversion elements and the one of the N-type thermoelectric conversion elements being adjacent to each other and constituting an outermost column among the columns, and the first connection electrode electrically connecting the one end face P with the one end face N; and
a second connection electrode that electrically connects one end face of one of the P-type thermoelectric conversion elements with one end face of one of the N-type thermoelectric conversion elements in a second direction crossing the first direction,
wherein the P-type thermoelectric conversion elements and the N-type thermoelectric conversion elements of adjacent columns are arranged in a zigzag arrangement, and wherein the thermoelectric conversion element group includes a sequence in which the P-type thermoelectric conversion elements and the N-type thermoelectric conversion elements are physically arranged in an order of "P-type-P-type-N-type-N-type" along the second direction.

2. A method of manufacturing a thermoelectric conversion element module, comprising:
a step of preparing a plurality of P-type thermoelectric conversion elements, each comprising a tube P made of a heat-resistant insulating material filled with a P-type thermoelectric conversion material, and a plurality of N-type thermoelectric conversion elements, each comprising a tube N made of a heat-resistant insulating material filled with an N-type thermoelectric conversion material;
step A of alternately arranging the P-type thermoelectric conversion elements and the N-type thermoelectric conversion elements along a first direction and in a manner so as to contact each other to form a first thermoelectric conversion element column in which the tubes of the elements are in parallel with each other;
step B of applying an adhesive to a peripheral surface of the P-type thermoelectric conversion elements and a peripheral surface of the N-type thermoelectric conversion elements of the first thermoelectric conversion element column;
step C of alternately arranging the P-type thermoelectric conversion elements and the N-type thermoelectric conversion elements along the first direction to form a second thermoelectric conversion element column in which the tubes of the elements are in parallel with each other, the second thermoelectric conversion element column being disposed on the first thermoelectric conversion element column via the applied adhesive;
step D of repeating step B and step C so as to obtain the thermoelectric conversion element group;
a second step of forming a connection electrode layer which covers one end face P and a side portion of the P-type thermoelectric conversion elements and which covers one end face N and a side portion of the N-type thermoelectric conversion elements;
a third step of patterning the connection electrode layer so as to cut off between the P-type thermoelectric conversion elements and the N-type thermoelectric conversion elements along a second direction crossing the first direction; and
a fourth step of patterning the connection electrode layer so as to cut off along the first direction between sets, each set composed of one of the P-type thermoelectric conversion elements and one of the N-type thermoelectric conversion elements neighboring each other in the second direction,
wherein one of the P-type thermoelectric conversion elements or one of the N-type thermoelectric conversion elements of the second thermoelectric conversion element column is disposed on the first thermoelectric conversion element column and in contact with both another one of the P-type thermoelectric conversion elements and another one of the N-type thermoelectric conversion elements of the first thermoelectric conversion element column.

* * * * *